United States Patent [19]

Gudel

[11] Patent Number: 4,939,448
[45] Date of Patent: Jul. 3, 1990

[54] ELECTRIC CURRENT SENSING DEVICE OF THE MAGNETIC FIELD COMPENSATIONTYPE

[75] Inventor: Claude Gudel, Annemasse, France

[73] Assignee: Liaisons Electroniques-Mecaniques LEM SA, Switzerland

[21] Appl. No.: 260,727

[22] Filed: Oct. 14, 1988

[30] Foreign Application Priority Data

Oct. 16, 1987 [CH] Switzerland .......... 4072/87

[51] Int. Cl.⁵ .......... G01R 1/04; G01R 33/00
[52] U.S. Cl. .......... 324/117 R; 324/117 H; 324/225; 324/251; 324/127
[58] Field of Search .......... 324/117 R, 117 H, 251, 324/252, 235, 225, 127; 338/32 H, 32 R; 307/309; 336/84 R, 84 M

[56] References Cited

U.S. PATENT DOCUMENTS

| | | | |
|---|---|---|---|
| 3,573,616 | 4/1971 | Kahen | 324/117 H |
| 4,639,665 | 1/1987 | Gary | 324/117 H |
| 4,791,361 | 12/1988 | Beihoff et al. | 324/117 R |

FOREIGN PATENT DOCUMENTS 0618580  4/1961  Canada .

Primary Examiner—Reinhard J. Eisenzopf
Assistant Examiner—Vinh P. Nguyen
Attorney, Agent, or Firm—Woodard, Emhardt, Naughton, Moriarty & McNett

[57] ABSTRACT

A magnetic circuit is coupled with a primary conductor in which flows the current to be sensed. The magnetic circuit has an air gap with a magnetic field detector and is coupled with a measuring coil producing a magnetic flux for compensation the flux generated by the primary current. The necessary current in the measuring coil to achieve such flux compensation is a measure for the primary current. A yoke part of high magnetic permeability is arranged in the vicinity of the air gap inside the measuring coil so as to form a magnetic shunt between the two magnetic circuit portions forming the air gap.

8 Claims, 2 Drawing Sheets

ELECTRIC CURRENT SENSING DEVICE OF THE MAGNETIC FIELD COMPENSATION TYPE

The present invention relates to an electric current sensing device to be used for measuring a relatively high current flowing in a conductor and/or for producing an image thereof. More particularly, the invention relates to a current sensing device of the type comprising at least one magnetic circuit so as to be capable of being coupled with a primary conductor in which flows the current to be sensed, the magnetic circuit having at least one air gap and at least one measuring coil being coupled with said circuit. In such a device, magnetic field detector means are arranged in the air gap and a control circuit associated with a current source has input terminals coupled with said magnetic field detector means, and has output terminals connected to a series connection of said measuring coil and current measuring and/or displaying means.

Current sensing devices of the above type are used for measuring a primary current, the term "measuring" being understood to include all kinds of producing a magnitude representing a measure of the current, such as producing a voltage or a current which follow the instantaneous values of the primary current. Further, the production of an image of the primary current is meant to include all kinds of displaying, recording or memorizing the values of the primary current such as, for example, its instantaneous, maximum and mean values or characteristics of its variations in time. It is understood that the magnitude measured can be used depending on the applications of the present device for controlling or actuating other devices, for instance in regulating or controlling circuits.

The operation of sensing devices of this type is based on the principle of compensation of the magnetic flux generated by the primary current, by a flux generated by the measuring coil under the control of said magnetic field detector means. The current in the measuring coil required to achieve the compensation is a measure for the primary current.

The main object of the present invention is to improve the measuring precision of sensing devices of the above mentioned type and, more particularly, to increase the fidelity of reproduction of high frequency components of the current to measure.

In accordance with the invention, the present current sensing device comprises at least one yoke part of high magnetic permeability arranged inside said measuring coil in the vicinity of said air gap, so as to constitute a magnetic shunt between the two magnetic circuit portions forming said air gap.

According to a preferred embodiment of the invention, the yoke part is insulated from at least one of the magnetic circuit portions forming the air gap by a layer of an amagnetic material arranged between said yoke part and said portion of the magnetic circuit, the yoke part thus forming a magnetic shunt of the air gap without short-circuiting the same. The yoke part preferably extends over a length substantially equal to that of the measuring coil inside which it is arranged.

It has been found, surprisingly, that the presence of such a yoke part substantially improves the measuring precision of the sensing device, in particular at high frequencies, allowing to extend the transmission band of the device from direct current up to a frequency above 100 kHz.

Further features and advantages of the device according to the present invention will appear more clearly from the following description, given by way of example, of a preferably embodiment illustrated in the attached drawings in which FIG. 1 is a partly sectional view of a sensing device according to the invention, seen in the direction of a primary conductor, but shown without the electric circuit and the casing of the sensing device.

Figure 1:
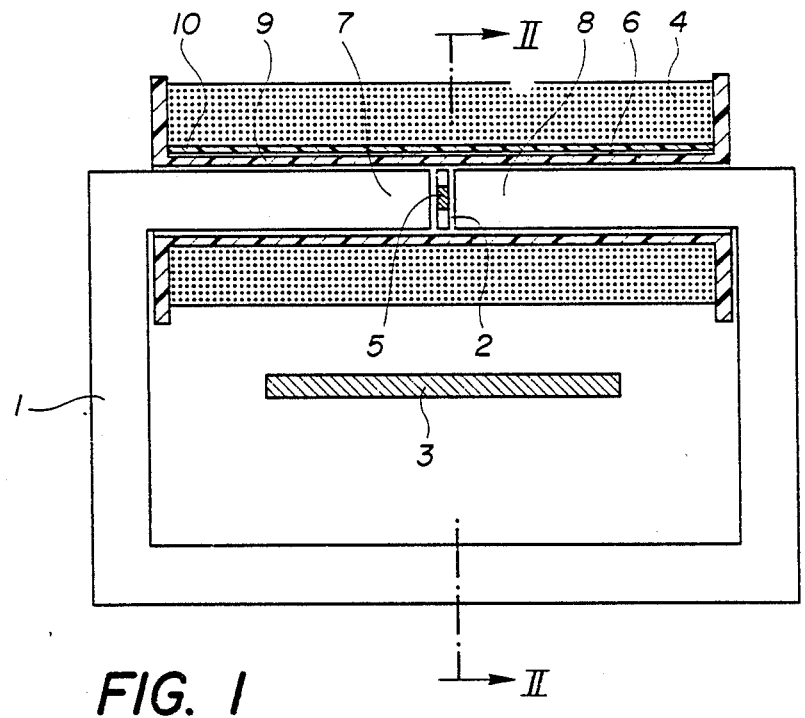
Figure 2:
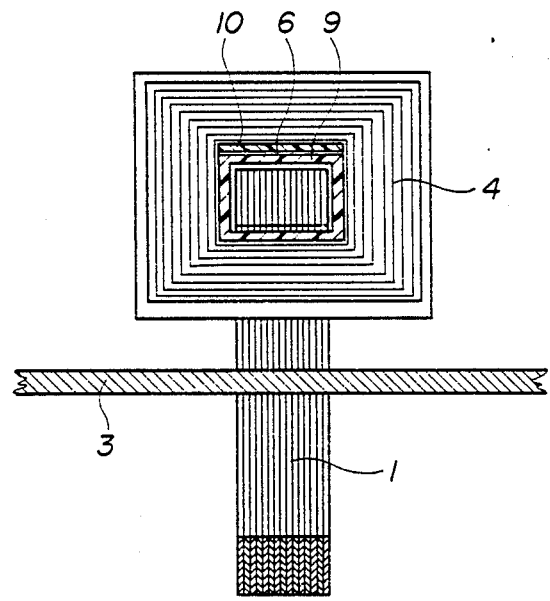
FIG. 2 is a sectional view along line II—II of FIG. 1.

The sensing device shown in FIGS. 1 and 2 comprises a magnetic circuit 1 of generally rectangular shape which has an air gap 2 provided between portions 7 and 8 of the magnetic circuit. A primary conductor 3, shown in cross section in FIG. 1, extends through the inner space of the magnetic circuit, this generating therein a magnetic field when a primary current flows in said conductor.

At the location of air gap 2, an electric measuring coil 4 is arranged on the portions 7 and 8 of the magnetic circuit, this coil being connected to a control circuit associated with a current source, as will be described hereafter in relation with FIG. 3. Magnetic field detector means, such as a Hall effect detector 5, are lodged inside the air gap 2, as shown in FIG. 1.

Figure 3:
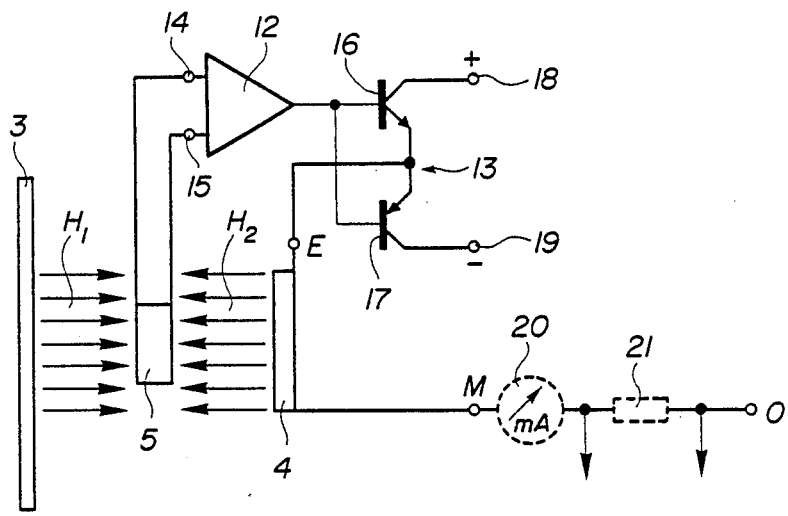
FIG. 3 is a schematic diagram of the basic electric circuit of a sensing device as concerned by the invention.

Referring to the electric diagram of FIG. 3, the primary conductor 3, coupled with the magnetic circuit (not shown in FIG. 3), produces therein a magnetic field $H_1$. The measuring coil 4 is supplied with a measuring current, so as to produce a magnetic field $H_2$ in the opposite direction of field $H_1$. The Hall effect detector 5 produces an output signal which is applied to control circuit terminals 14,15. The control circuit comprises, in particular, an amplifier 12 and a measuring current supply circuit 13, including a pair of transistors 16,17 connected in series between current source terminals 18 and 19. The output of amplifier 12 is connected to control electrodes of transistors 18,19, the emitters of which are connected together to a first terminal E of the measuring coil 4. The second terminal M of that coil is connected through a current measuring device 20 and/or a measuring resistor 21 of low resistance, to the ground of the device represented by terminal O.

When a primary current is flowing in conductor 3, the Hall effect detector 5 detects the difference between the fields $H_1$ and $H_2$ and provides a control signal which is used to control the measuring current in coil 4, so as to bring said difference to zero. The current measured between terminals M and O therefore represents at each moment the value of the primary current, thus providing or allowing to produce an image thereof.

FIGS. 1 and 2 show a preferred arrangement and shape of a yoke part 6 which is made, in this example, from a sheet of a material of high magnetic permeability, such as mumetal, arranged along one surface of the portions 7 and 8 of the magnetic circuit.

Other configurations can of course been chosen for the yoke part which preferably extends over substantially the same length as the measuring coil inside which it is arranged. Also more than one yoke part can be arranged in the same measuring coil, but it should be avoided that a closed electric circuit be formed in the transverse direction of portions 7,8 of the magnetic circuit, which would result iin eddy current losses.

Furthermore, a magnetic insulation is provided between the lateral surfaces of said portions of the magnetic circuit forming the air gap and the yoke part, so as to avoid magnetic short-circuiting of the air gap, while providing a certain magnetic coupling between circuit 1 and part 6. This insulation is realized, for example, by the carcase or body 9 of the measuring coil, which body is made of an amagnetic material, such as a suitable plastic material. Furthermore, an insulating and mechanically protecting sheet 10 is arranged between the yoke part and the winding of the coil.

The yoke part 6, the thickness of which can be very small as compared to the transversal dimensions of the magnetic circuit 1 and which preferably extends over a length substantially equal to that of the coil in which it is placed, constitutes a magnetic shunt coupled with portions 7 and 8 of the magnetic circuit in parallel to the air gap. It appears, inexpectedly, that the presence of such a yoke part leads to a substantial improvement of the measuring precision of the sensing device.

The improvement obtained by the present sensing device results in a greater fidelity of the image of the primary current, mainly regarding the response to fast transitions which can occur in that current.

In particular, transitory oscillations or delays with respect to fast variations of the primary current appear to be absent in the image of the primary current, as provided by the measuring current.

Furthermore, the error represented by the difference between the intensity of the primary current and the intensity of the measuring current multiplied by the number of turns of the winding of the measuring coil, is not only extremely small at direct current and at low technical frequencies, but is also considerably reduced at higher frequencies, namely up to frequencies over 100 kHz. Accordingly, a sensing device is provided, in which the transmission band extends from 0 to more than 100 kHz. This feature is of a great importance for all applications in which the primary current is subject to transitions within very short periods of time and the frequency spectrum of which is therefore rich in harmonics. The precision with which the measuring current follows the variations of the primary current up to the fastest variations is primordial, for example in the case of regulation or a control of the primary current as a function of the measuring current.

I claim:

1. An electric current sensing device to be used for measuring a relatively high current flowing in a primary conductor and/or for producing an image thereof, comprising at least one magnetic circuit capable of being magnetically coupled with said primary conductor and having at least one air gap, at least one measuring coil coupled with said magnetic circuit, magnetic field detector means arranged inside said air gap, a control circuit and an associated current source having input terminals coupled with said magnetic field detector means, and having output terminals connected to a series connection of said measuring coil and current measuring and/or displaying means, said sensing device further comprising at least one yoke part of high magnetic permeability arranged inside said measuring coil in the vicinity of said air gap, so as to constitute a magnetic shunt between the two magnetic circuit portions forming said air gap.

2. A device as claimed in claim 1, wherein said yoke part is insulated from at least one of said magnetic circuit portions forming the air gap, by a layer of an amagnetic material arranged between said yoke part and said portion of the magnetic circuit.

3. A deivce as claimed in claim 2, wherein said yoke part is formed by at least one sheet member of a very small thickness with respect to the dimensions of the cross section of the magnetic circuit portions forming the air gap.

4. A device according to claim 3, wherein said yoke part extends over a length substantially equal to that of the measuring coil inside which it is arranged.

5. A device according to claim 2, wherein said yoke part extends over a length substantially equal to that of the measuring coil inside which it is arranged.

6. A device as claimed in claim 1, wherein said yoke part is formed by at least one sheet member of a very small thickness with respect to the dimensions of the cross section of the magnetic circuit portions forming the air gap.

7. A device according to claim 6, wherein said yoke part extends over a length substantially equal to that of the measuring coil inside which it is arranged.

8. A device as claimed in claim 1, wherein said yoke part extends over a length substantially equal to that of the measuring coil inside which it is arranged.

* * * * *

UNITED STATES PATENT AND TRADEMARK OFFICE
CERTIFICATE OF CORRECTION

PATENT NO. : 4,939,448

DATED : July 3, 1990

INVENTOR(S) : Claude Gudel

It is certified that error appears in the above-identified patent and that said Letters Patent is hereby corrected as shown below:

In the title of the invention, box 54, line 3, please delete "COMPENSATIONTYPE" and insert in lieu thereof --COMPENSATION TYPE--.

In the title of the invention, column 1, line 2, please delete "COMPENSATIONTYPE" and insert in lieu thereof --COMPENSATION TYPE--.

In column 4, line 25, please delete the word "deivce" and insert in lieu thereof the word --device--.

Signed and Sealed this

Twenty-fifth Day of June, 1991

Attest:

*Attesting Officer*

HARRY F. MANBECK, JR.

*Commissioner of Patents and Trademarks*